(12) United States Patent
Zhang

(10) Patent No.: US 9,641,195 B2
(45) Date of Patent: May 2, 2017

(54) TRELLIS CODED MODULATION

(71) Applicant: Intel Corporation, Santa Clara, CA (US)

(72) Inventor: Yuwei Zhang, Pleasanton, CA (US)

(73) Assignee: Intel Corporation, Santa Clara, CA (US)

(*) Notice: Subject to any disclaimer, the term of this patent is extended or adjusted under 35 U.S.C. 154(b) by 59 days.

(21) Appl. No.: 14/577,531

(22) Filed: Dec. 19, 2014

(65) Prior Publication Data

US 2015/0358033 A1    Dec. 10, 2015

Related U.S. Application Data

(60) Provisional application No. 62/050,846, filed on Sep. 16, 2014, provisional application No. 62/008,748, filed on Jun. 6, 2014.

(51) Int. Cl.
*H03M 13/00* (2006.01)
*H03M 13/25* (2006.01)

(52) U.S. Cl.
CPC .................. *H03M 13/256* (2013.01)

(58) Field of Classification Search
CPC ..................................... H03M 13/256
See application file for complete search history.

(56) References Cited

U.S. PATENT DOCUMENTS 6,298,463 B1 * 10/2001 Bingeman ......... H03M 13/2778
714/755

OTHER PUBLICATIONS

Wicker, Error Control Systems for Digital Communication and storage,1995 Prentice hall, pp. 271/272.*

* cited by examiner

*Primary Examiner* — Sam Rizk
(74) *Attorney, Agent, or Firm* — Schiff Hardin LLP

(57) ABSTRACT

A trellis coded modulator and method for generating an encoded word from an input word. The TCM has a first logic branch configured to generate a data portion of the encoded word; and a second logic branch, coupled in parallel with the first logic branch, and configured to generate a corresponding parity portion of the encoded word sequentially after the generation of the data portion of the encoded word.

22 Claims, 10 Drawing Sheets

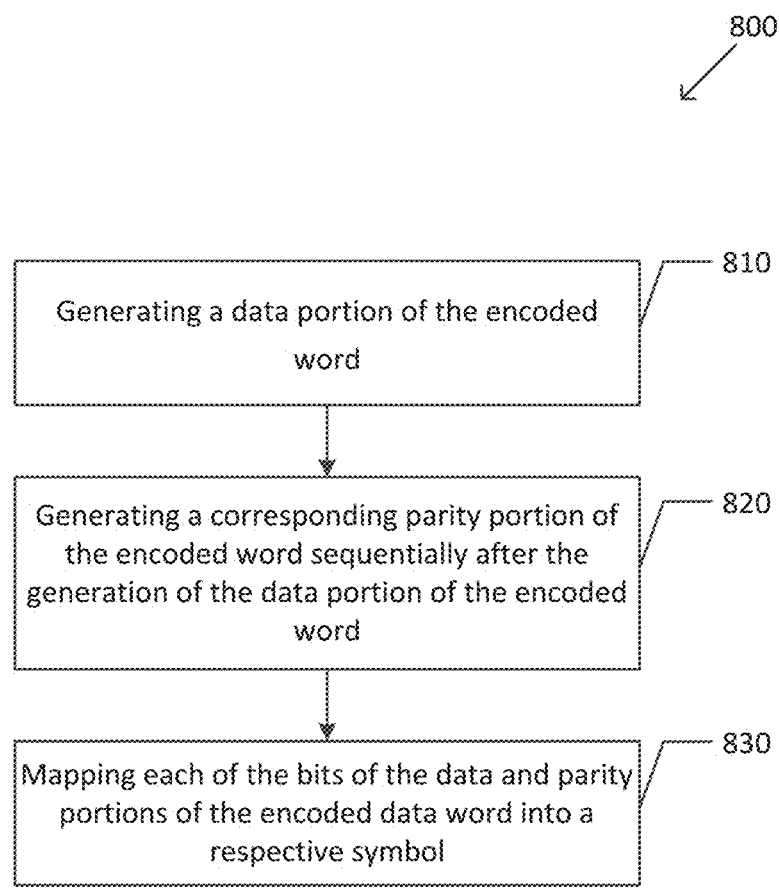

TRELLIS CODED MODULATION

TECHNICAL FIELD

The present disclosure generally relates to trellis coded modulation in continuous phase modulation systems.

BACKGROUND

Trellis coded modulation is a combination of convolutional coding and modulation. A convolutional code, or trellis code, is an error-correcting code in which each m-bit information symbol to be encoded is transformed into an n-bit symbol. These n bits are modulated, that is converted to analog form via a sinusoidal carrier, and transmitted. In trellis coded modulation, the coding and modulation are combined in one function.

BRIEF DESCRIPTION OF THE DRAWINGS

FIG. 8 illustrates flowchart of a method for generating a trellis coded modulation encoded word.

DESCRIPTION OF THE EMBODIMENTS

The present disclosure is directed to a trellis coded modulator for generating an encoded word from an input word, wherein a parity portion of the encoded word is generated sequentially after the generation of the data portion of the encoded word. Also, each coded bit has an independent coding state.

Figure 1:
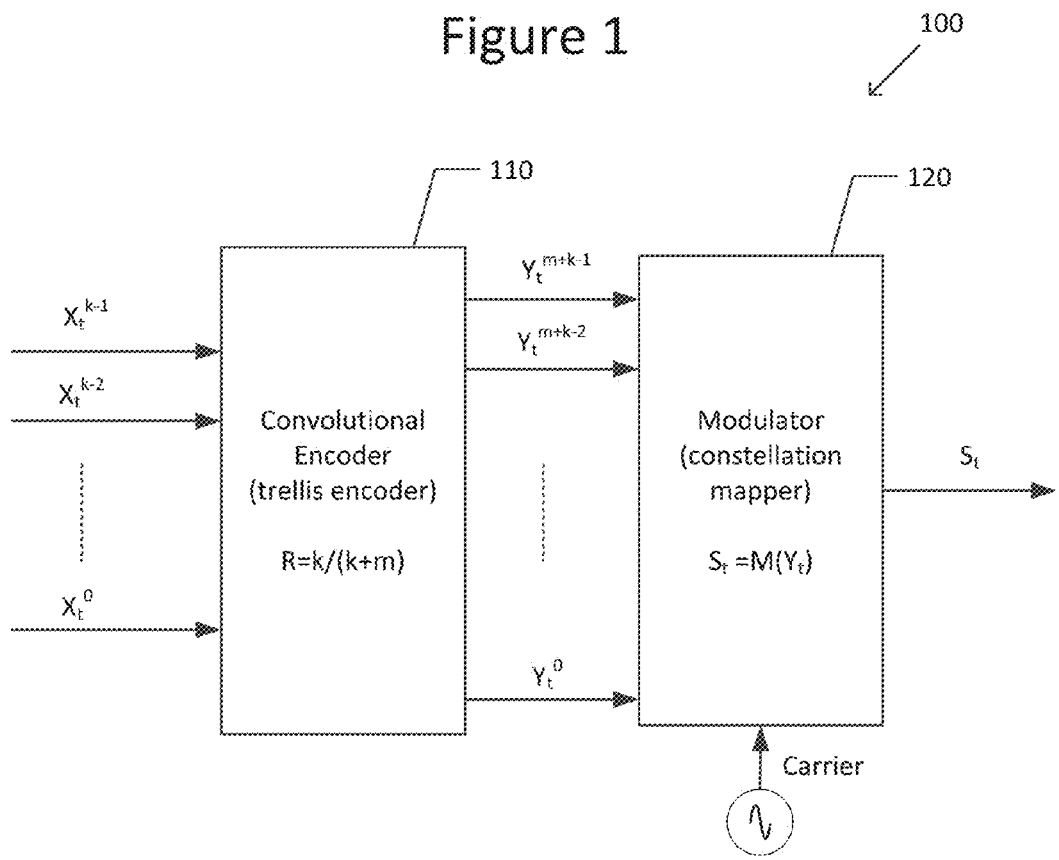
FIG. 1 illustrates a schematic diagram of a general structure of a trellis coded modulator (TCM).

FIG. 1 illustrates a schematic diagram of a general structure of a trellis coded modulator (TCM) 100.

TCM 100 comprises a convolutional encoder 110 and a modulator 120. The convolutional encoder 110, or trellis encoder, is configured to encode, at time t, k bits of input data X at a rate R=k/(k+m) to become k+m bits of coded data Y, where m is greater than or equal to 1.

The modulator 120, or constellation mapper, is configured to modulate the k+m bits of coded data Y to a constellation point $S_t$ having a maximized Euclidean distance. As is known, the Euclidean distance is a straight line distance between any two points. Trellis coded modulation has been used with various modulations, such as continuous phase modulation (CPM) in which the carrier phase is modulated in a continuous manner rather than being reset to zero at the beginning of every symbol. One type of CPM is Gaussian frequency-shift keying (GFSK), for example.

Trellis coded modulation maintains system bandwidth by increasing modulation levels $2^m$ times. However, not every application permits performance enhancement by increasing modulation levels. For example, the modulation scheme for long range Bluetooth is 2GFSK, and known trellis coded modulation schemes cannot be applied to 2GFSK to achieve a desired coding gain.

Figure 2:
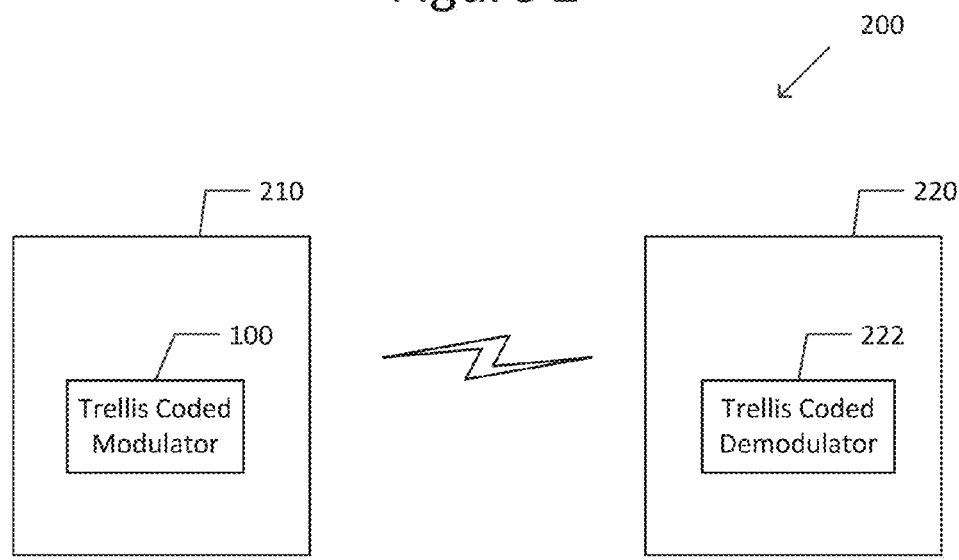
FIG. 2 illustrates a schematic diagram of a wireless communication system.

FIG. 2 illustrates a schematic diagram of a wireless communication system 200. The system 200 includes a first wireless communication device 210 and a second wireless communication device 220 that may be in wireless communication with each other. The first wireless communication device 210 includes the trellis coded modulator 100 of FIG. 1, and the second wireless communication device 220 includes a trellis coded demodulator 222 configured to decode and demodulate signals received from the first wireless communication device 210. Although not shown, it is understood that the first wireless communication device 210 additionally includes a trellis coded demodulator, and wireless communication device 220 additionally includes a trellis coded modulator.

In a known trellis coded modulator having a ⅓ rate, for example, every input bit $X_t^0$ is encoded into three output bits $Y_t^2, Y_t^1, Y_t^0$. If 8GFSK modulation is permitted, then the coded output bits $Y_t^2, Y_t^1, Y_t^0$ are modulated into an 8GFSK signal. At the receiver side, that is, at the second wireless communication device 220, the coding state is combined with an 8GFSK signal phase state to jointly demodulate and decode, thereby optimizing system performance. But if only 2GFSK modulation is permitted, the three coded output bits $Y_t^2, Y_t^1, Y_t^0$ are modulated into three consecutive 2GFSK symbols. At the receiver side, each of the three consecutive received symbols $Y_t^2, Y_t^1, Y_t^0$ has its own phase state. With CPM the phase is not reset at the beginning of each of the three symbols, and as a result demodulation and decoding cannot be performed jointly. The convolutional encoder of the TCM of this disclosure overcomes this drawback by coding each symbol to have an independent coding state.

Figure 3A:
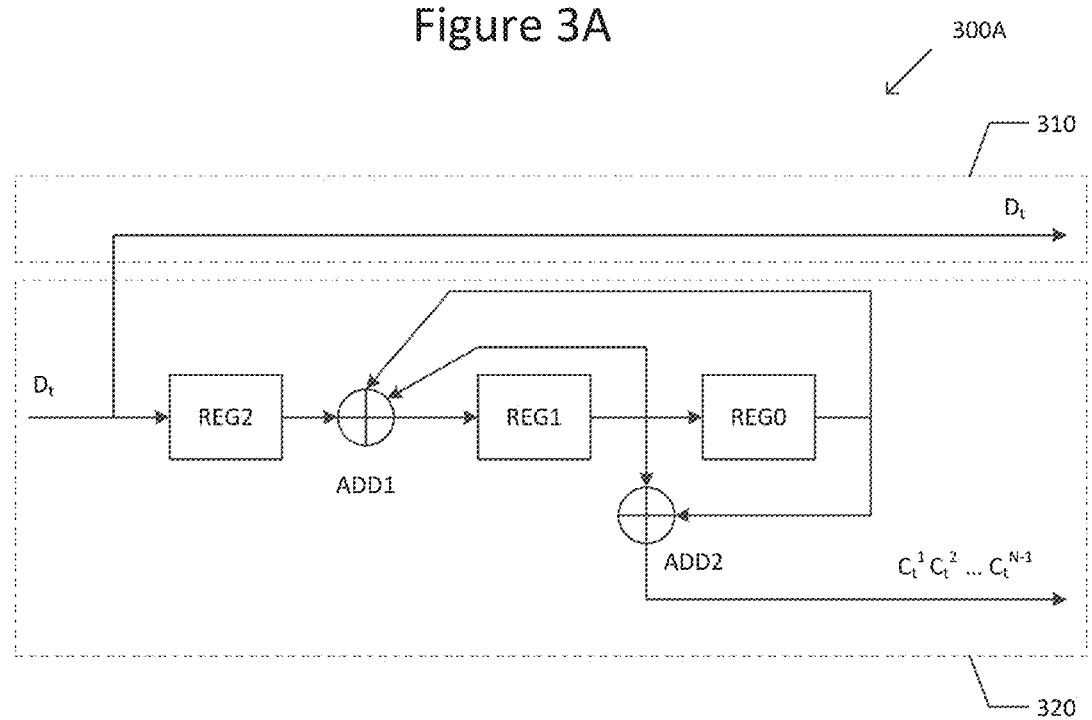
FIG. 3A illustrates a schematic diagram of a convolutional encoder of the TCM of FIG. 1.

FIG. 3A illustrates a schematic diagram of a convolutional encoder 300A of the TCM 100 of FIG. 1.

The convolutional encoder 300A generates an encoded word $D_t \, C_t^1 C_t^2 \ldots C_t^{N-1}$ from an input word $D_t$. The convolutional encoder 300A in this example is an eight-state 1/N rate encoder, where N represents a number of output bits for every input bit. For an input word $D_t$, which in this example is one bit, the encoder 300A is configured to generate N output bits $D_t \, C_t^1 \, C_t^2 \ldots C_t^{N-1}$. The code is systematic, which means the input word $D_t$ is embedded in the encoded word $D_t \, C_t^1 C_t^2 \ldots C_t^{N-1}$ that is output.

The convolutional encoder 300A has a first logic branch 310 and a second logic branch 220. The first logic branch 310 is configured to generate a data portion $D_t$ of the encoded word $D_t \, C_t^1 C_t^2 \ldots C_t^{N-1}$. The second logic branch 320, which is coupled in parallel with the first logic branch 310, is configured to generate a corresponding parity portion $D_t \, C_t^1 C_t^2 \ldots C_t^{N-1}$ of the encoded word $D_t \, C_t^1 C_t^2 \, C_t^{N-1}$ sequentially after the generation of the data portion $D_t$ of the encoded word $D_t \, C_t^1 C_t^2 \ldots C_t^{N-1}$. The convolutional encoder 300A is recursive in that the second branch 320 has a feedback structure, though the disclosure is not limited in this respect.

The second logic branch 320 has a first register REG2, a first modulo 2 adder ADD1, a second register REG1, a second modulo 2 adder ADD2, and a third register REG0. The registers may be flip-flip registers, though the disclosure is not limited in this respect. As is known, a modulo 2 adder is an adder where the sum "wraps around" upon reaching the modulus value of 1. The first register REG 2 has an input configured to receive the input word $D_t$ and has an output. The first modulo 2 adder ADD1 has a first input coupled to the output of the first register REG2, a second input, a third input, and an output. The second register REG1 has an input coupled to the output of the first modulo 2 adder ADD1 and an output coupled to the third input of the first modulo 2 adder ADD1. The second modulo 2 adder ADD2 has a first input coupled to the output of the second register REG1, a second input, and an output configured to output the parity portion $C_t^1 C_t^2 \ldots C_t^{N-1}$ of the encoded word $D_t C_t^1 C_t^2 \ldots C_t^{N-1}$. The third register REG0 has an input coupled to the output of the second register REG1, and an output coupled to the second input of the first modulo 2 adder ADD1 and to the second input of the second modulo 2 adder ADD2.

The first register REG2 is configured to hold a final bit of the input word $D_t$ until after the parity portion $C_t^1 C_t^2 \ldots C_t^{N-1}$ of the encoded word $D_t C_t^1 C_t^2 \ldots C_t^{N-1}$ is generated. This second REG2 increases a constraint length of the convolutional encoder 300A. As is known, a constraint length is a size of the convolutional encoder's 110 coding window.

After the encoded word $D_t C_t^1 C_t^2 \ldots C_t^{N-1}$ is generated by the convolutional encoder 300A, the modulator 120, shown in FIG. 1, modulates each of the bits of the data portion $D_t$ and of the parity portion $C_t^1 C_t^2 \ldots C_t^{N-1}$ of the generated encoded data word $D_t C_t^1 C_t^2 \ldots C_t^{N-1}$ into a respective symbol $S_t$ to be output by the TCM 100. The modulator 120 is configured to perform continuous phase modulation. For example the modulator 120 may be configured to perform GFSK (Gaussian frequency-shift keying) modulation, such as 2GFSK modulation, though the disclosure is not limited in this respect.

The encoder 300A differs from known convolutional encoders by the addition of the first register REG2, and also has different timing. Known convolutional encoders generate for an input word the encoded bits simultaneously; this is not the case with encoder 300A. When the input word $D_t$ is stored in the first register REG2 at a first time instant, the upper branch 310 of the encoder 300A outputs the input word $D_t$ as the data portion of the encoded word $D_t C_t^1 C_t^2 \ldots C_t^{N-1}$. The input word $D_t$ is also held in the first register REG2, and N−1 coded bits are output by the second branch 320 during the at next N−1 time instants. The state of the convolutional encoder 300A is updated at every time instant, so each of the N coded bits is associated with an independent coding state. As a result, the structure of a known trellis coded demodulator receiving the N coded bits can be applied by combining the phase state and coding state together for every received symbol. At the receiving side, it is not necessary to wait for all symbols to be received first.

Figure 3B:
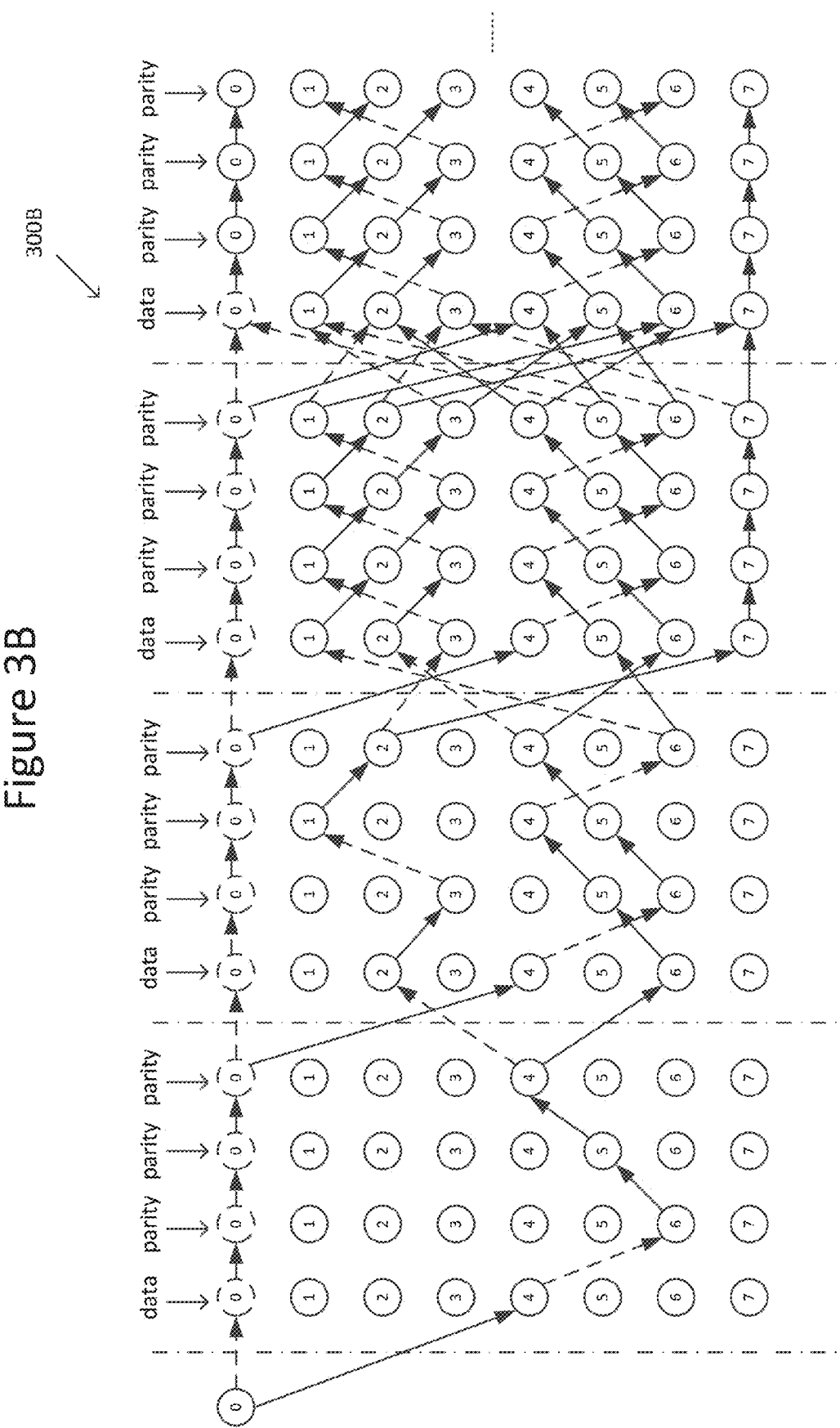
FIG. 3B illustrates a trellis diagram of the convolutional encoder of FIG. 3A.

FIG. 3B illustrates a trellis diagram 300B of the convolutional encoder 300A of FIG. 3A. The convolutional encoder 300A has a ¼ rate recursive (17, 3) code. A ¼ rate means that for every input bit there are four coded output bits. The (17,3) code is standard nomenclature in which 7 is based on the three inputs to the first adder ADD1 in octal format (i.e., octal 111, which is equivalent to 7), and 3 generally represents the number of registers plus 1. In this case, however, the standard nomenclature is modified to account for the additional register, that is, the first register REG2. The known convolutional encoder has the second and third registers REG1, REG0, resulting in the number 3 (two registers, REG1, REG0, plus 1). The additional register, REG2, of the convolutional encoder 300A is represented by the 1 of the number 17.

In the trellis diagram 300B the convolutional encoder 300A is initialized to all 0s. A dashed arrow indicates that the encoding output is 0 with the associated state transition, and a solid arrow indicates that the encoding output is 1. The dashed, vertical lines group the output bits, which is one input bit plus three parity bits. If the first input word $D_t$ is 1, the symbol is 1 0 0, so the first output in the trellis diagram 300B, as indicated by the convolutional encoder 300A, is 4. The first register REG2 holds this first input word $D_t$ for the generation of the three parity check bits. The trellis diagram 200B shows that the state transition becomes stable after three bits of input words, after which the transition pattern repeats. The detailed trellis termination procedure is generally known and not discussed in further detail here as there are many options for codes with different generator polynomials.

Figure 3C:
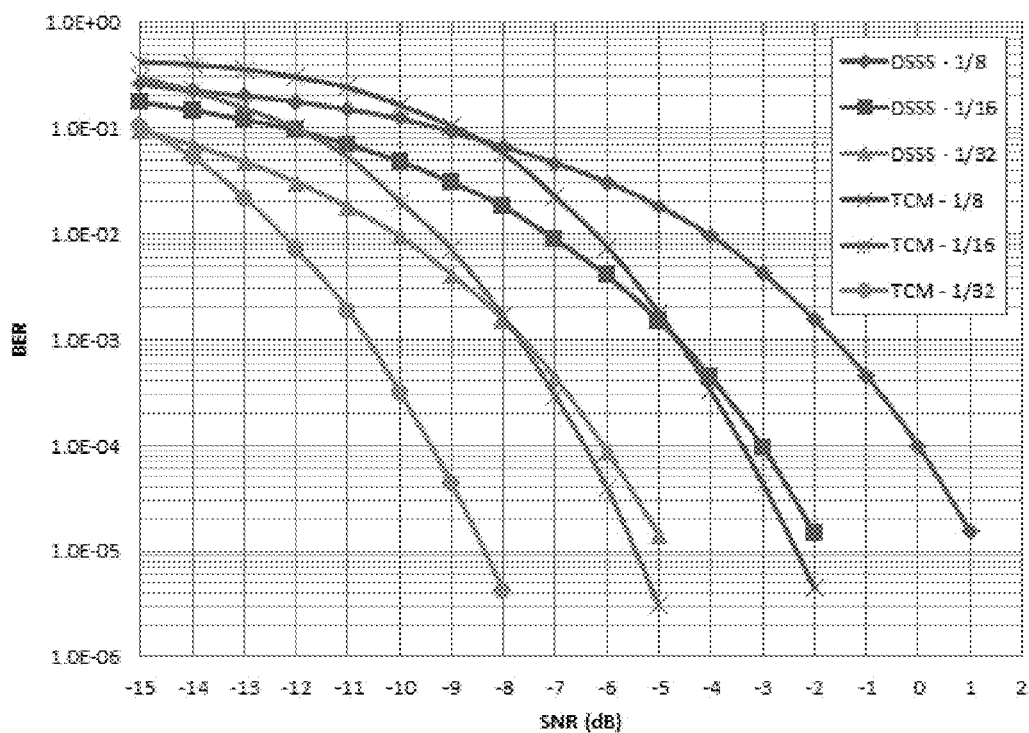
FIG. 3C illustrates a performance comparison graph between direct-sequence spread spectrum (DSSS) and TCM performed by the convolutional encoder of FIG. 3A.

FIG. 3C illustrates a performance comparison graph 300C between direct-sequence spread spectrum (DSSS) and trellis coded modulation performed by a TCM having the convolutional encoder 300A. The graph shows bit error rate (BER) versus signal-to-noise ratio (SNR).

The performances of the TCM code (17,3) were simulated under 2GFSK modulation having a modulation index h=0.5 and a Gaussian phase shaping factor BT=0.5. This modulation index and Gaussian phase shaping factor are merely examples; the disclosure is not limited in these respects. The coding rates simulated are ⅛, 1/16, and 1/32. The results show that for the same coding rates, the TCM encoder 200A outperformed the DSSS scheme by more than 3 dB.

Figure 4:
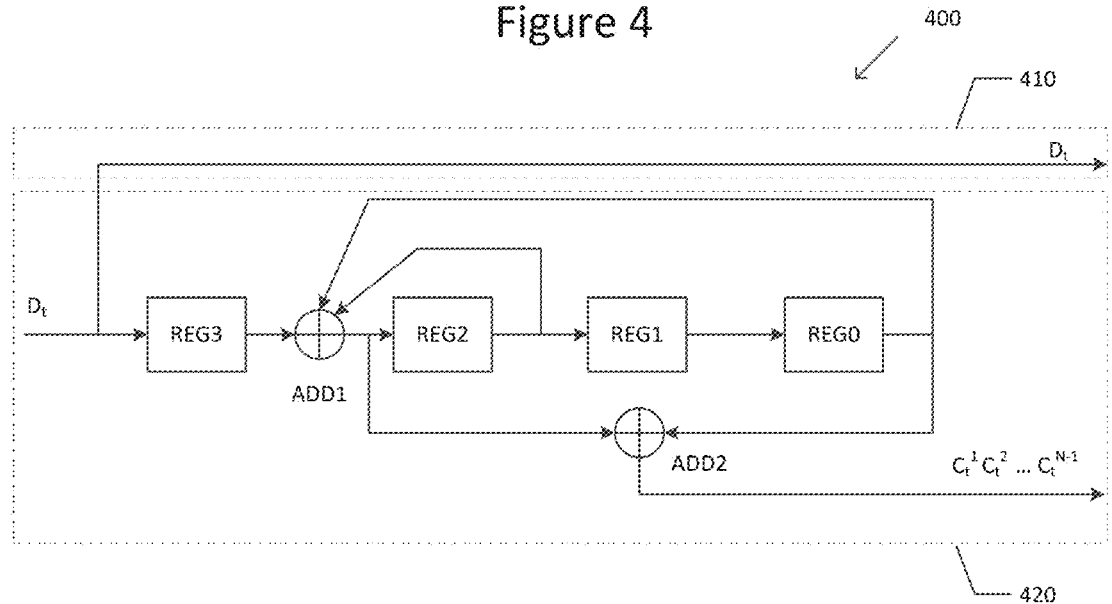
FIG. 4 illustrates a schematic diagram of an alternative convolutional encoder of the TCM of FIG. 1.

FIG. 4 illustrates a schematic diagram of an alternative convolutional encoder 400 of the TCM 100 of FIG. 1. In this case the encoder 300 has a (35,11) code.

The convolutional encoder 400 generates an encoded word $D_t C_t^1 C_t^2 \ldots C_t^{N-1}$ from an input word $D_t$. The convolutional encoder 400 has a first logic branch 410 and a second logic branch 420.

The first logic branch 410 is configured to generate a data portion $D_t$ of the encoded word $D_t C_t^1 C_t^2 \ldots C_t^{N-1}$. The second logic branch 420, which is coupled in parallel with the first logic branch 410, is configured to generate a corresponding parity portion $C_t^1 C_t^2 \ldots C_t^{N-1}$ of the encoded word $D_t C_t^1 C_t^2 \ldots C_t^{N-1}$ sequentially after the generation of the data portion $D_t$ of the encoded word $D_t C_t^1 C_t^2 \ldots C_t^{N-1}$. The convolutional encoder 400 is recursive in that the second branch 320 has a feedback structure, though the disclosure is not limited in this respect.

The second logic branch 420 has a first register REG3, a first modulo 2 adder ADD1, a second register REG2, a second modulo 2 adder ADD2, a third register REG1, and a fourth register REG0. The first register REG3 has an input configured to receive the input word $D_t$ and an output. The first modulo 2 adder has a first input coupled to the output of the first register REG4, a second input, a third input, and an output. The second register REG2 has an input coupled to the output of the first modulo 2 adder ADD1 and an output coupled to the third input of the first modulo 2 adder ADD1. The second modulo 2 adder ADD2 has a first input coupled to the output of the first modulo 2 adder ADD1, a second input, and an output configured to output the parity portion $C_t^1 C_t^2 \ldots C_t^{N-1}$ of the encoded word $D_t C_t^1 C_t^2 \ldots C_t^{N-1}$. The third register REG1 has an input coupled to the output of the second register REG2 and an output. The fourth register REG0 has an input coupled to the output of the third register REG1, and an output coupled to the second input of the first modulo 2 adder ADD1 and to the second input of the second modulo 2 adder ADD2.

After the encoded word $D_t C_t^1 C_t^2 \ldots C_t^{N-1}$ is generated by the convolutional encoder 400, the modulator 120, shown in FIG. 1, is configured to modulate each of the bits of the of data portion $D_t$ and of the parity portion $C_t^1 C_t^2 \ldots C_t^{N-1}$ or the encoded data word $D_t C_t^1 C_t^2 \ldots C_t^{N-1}$ into a respective symbol $S_t$. The modulation types are as discussed above with respect to FIG. 3A.

Like convolutional encoder 300A discussed above, the convolutional encoder 400 differs from a known convolutional encoder by the addition of the first register REG3, and also has different timing. The known encoder generates for an input word $D_t$ encoded bits simultaneously. This is not the case with encoder 400. When the input word $D_t$ is stored in the first register REG3 at a first time instant, the upper branch 410 of the convolutional encoder 400 outputs the input word $D_t$ as the data portion of the encoded $D_t C_t^1 C_t^2 \ldots C_t^{N-1}$. The input word $D_t$ is also held in the first register REG3, and N−1 coded bits are output by the second branch 420 during the at next N−1 time instants. The state of the convolutional encoder 300A is updated at every time instant, so each of the N coded bits is associated with an independent coding state. As a result, the structure of a known trellis coded demodulator receiving the N coded bits can be applied by combining the phase state and coding state together for every received symbol. At the receiving side, it is not necessary to wait for all symbols to be received first.

Figure 5:
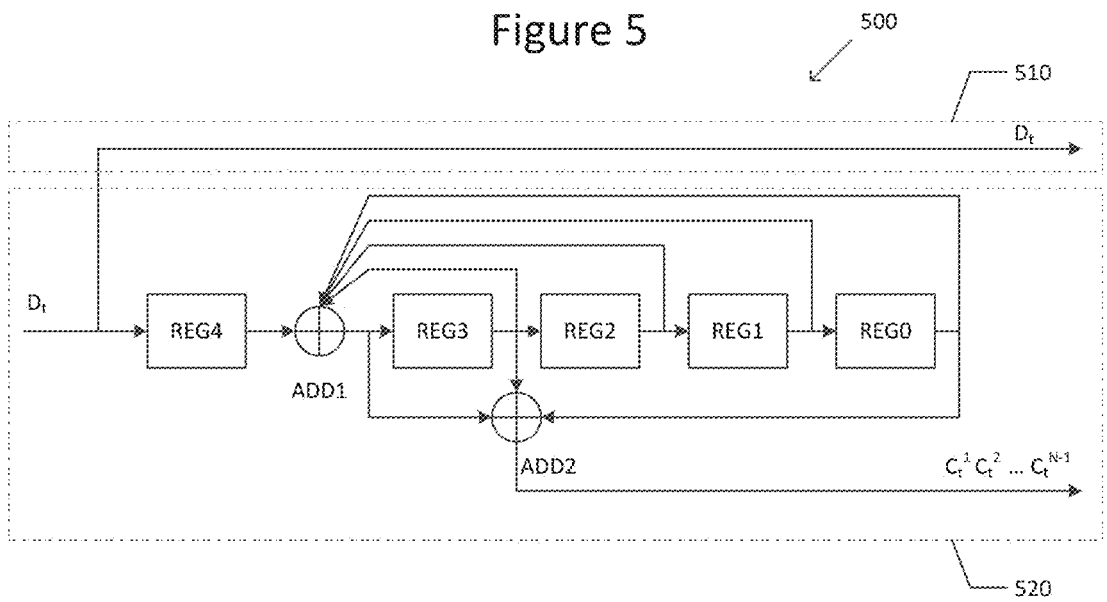
FIG. 5 illustrates a schematic diagram of an alternative convolutional encoder of the TCM of FIG. 1.

FIG. 5 illustrates a schematic diagram of an alternative convolutional encoder 500 of the TCM 100 of FIG. 1. In this case the convolutional encoder 500 has a (77, 31) code.

The convolutional encoder 500 generates an encoded word $D_t C_t^1 C_t^2 \ldots C_t^{N-1}$ from an input word $D_t$. The convolutional encoder 500 has a first logic branch 510 and a second logic branch 520.

The first logic branch 510 is configured to generate a data portion $D_t$ of the encoded word $D_t C_t^1 C_t^2 \ldots C_t^{N-1}$. The second logic branch 520, which is coupled in parallel with the first logic branch 510, is configured to generate a corresponding parity portion $C_t^1 C_t^2 \ldots C_t^{N-1}$ of the encoded word $D_t C_t^1 C_t^2 \ldots C_t^{N-1}$ sequentially after the generation of the data portion $D_t$ of the encoded word $D_t C_t^1 C_t^2 \ldots C_t^{N-1}$. The convolutional encoder 500 is recursive in that the second branch 320 has a feedback structure, though the disclosure is not limited in this respect.

The second logic branch 520 has a first register REG4, a first modulo 2 adder ADD1, a second register REG3, a second modulo 2 adder ADD2, a third register REG2, a fourth register REG1, and a fifth register REG0. The first register REG4 has an input configured to receive the input word $D_t$ and an output. The first modulo 2 adder ADD1 has a first input coupled to the output of the first register REG4, a second input, a third input, a fourth input, a fifth input, and an output. The second register REG3 has an input coupled to the output of the first modulo 2 adder ADD1 and an output coupled to the fifth input of the first modulo 2 adder ADD1. The second modulo 2 adder ADD2 has a first input coupled to the output of the first modulo 2 adder ADD1, a second input coupled to the output of the second register REG3, a third input, and an output configured to output the parity portion $C_t^1 C_t^2 \ldots C_t^{N-1}$ of the encoded word $D_t C_t^1 C_t^2 \ldots C_t^{N-1}$. The third register REG2 has an input coupled to the output of the second register REG3, and an output coupled to the fourth input of the first modulo 2 adder ADD1. The fourth register REG1 has an input coupled to the output of the third register REG2 and an output coupled to the third input of the first modulo 2 adder ADD1. The fifth register REG0 has an input coupled to the output of the fourth register REG1, and an output coupled to the second input of the first modulo 2 adder ADD1 and to the third input of the second modulo 2 adder ADD2.

After the encoded word $D_t C_t^1 C_t^2 \ldots C_t^{N-1}$ is generated by the convolutional encoder 500, the modulator 120, shown in FIG. 1, is configured to modulate each of the bits of the data portion $D_t$ and of the parity portion $C_t^1 C_t^2 \ldots C_t^{N-1}$ of the encoded data word $D_t C_t^1 C_t^2 \ldots C_t^{N-1}$ into a respective symbol $S_t$. The modulation types are as discussed above with respect to FIG. 3A.

Like convolutional encoders 300A and 400 discussed above, the convolutional encoder 500 differs from a known convolutional encoder by the addition of the first register REG4, and also has different timing. The known convolutional encoder generates for an input word $D_t$ encoded bits simultaneously. This is not the case with encoder 500. When the input word $D_t$ is stored in the first register REG4 at a first time instant, the upper branch 510 of the convolutional encoder 500 outputs the input word $D_t$ as the data portion of the encoded word $D_t C_t^1 C_t^2 \ldots C_t^{N-1}$. The input word $D_t$ is also held in the first register REG4, and N−1 coded bits are output by the second branch 520 during the at next N−1 time instants. The state of the convolutional encoder 500 is updated at every time instant, so each of the N coded bits is associated with its own coding state. As a result, the structure of a known trellis coded demodulator receiving the N coded bits can be applied by combining the phase state and coding state together for every received symbol. At the receiving side, it is not necessary to wait for all symbols to be received first.

For the convolutional encoders of the TCM 100 of the disclosure as discussed above, many codes are options, though the code with a maximum Euclidean distance is optimal. By way of example, the following codes are found to be optimal for long distance Bluetooth for coding rates ¼, ⅛, 1/16, and 1/32:

8-state code: (17, 3) code, which is represented in FIG. 3A;

16-state code: (35, 11), (35, 6) and (33, 12) code, where (35,11) is represented in FIGS. 4; and 32-state code: (77, 3), (77, 31) and (71, 11) code, where (77,31) is represented in FIG. 5.

Figure 6:
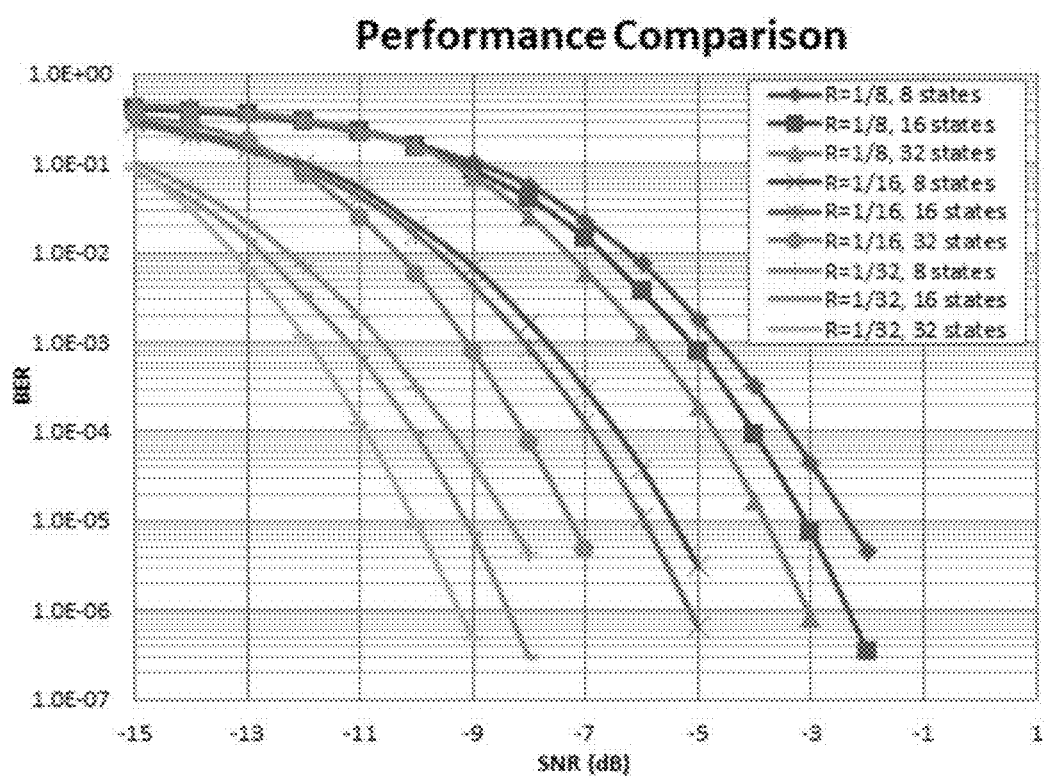
FIG. 6 illustrates a performance comparison graph of trellis coded modulation with different coding state numbers.

FIG. 6 illustrates a performance comparison graph 600 of trellis coded modulations with different codes. The graph shows bit error rate (BER) versus signal-to-noise ratio (SNR). As can be seen, for a given coding rate, the coding gain of the TCM of this disclosure increases with increasing coding state numbers.

Figure 7A:
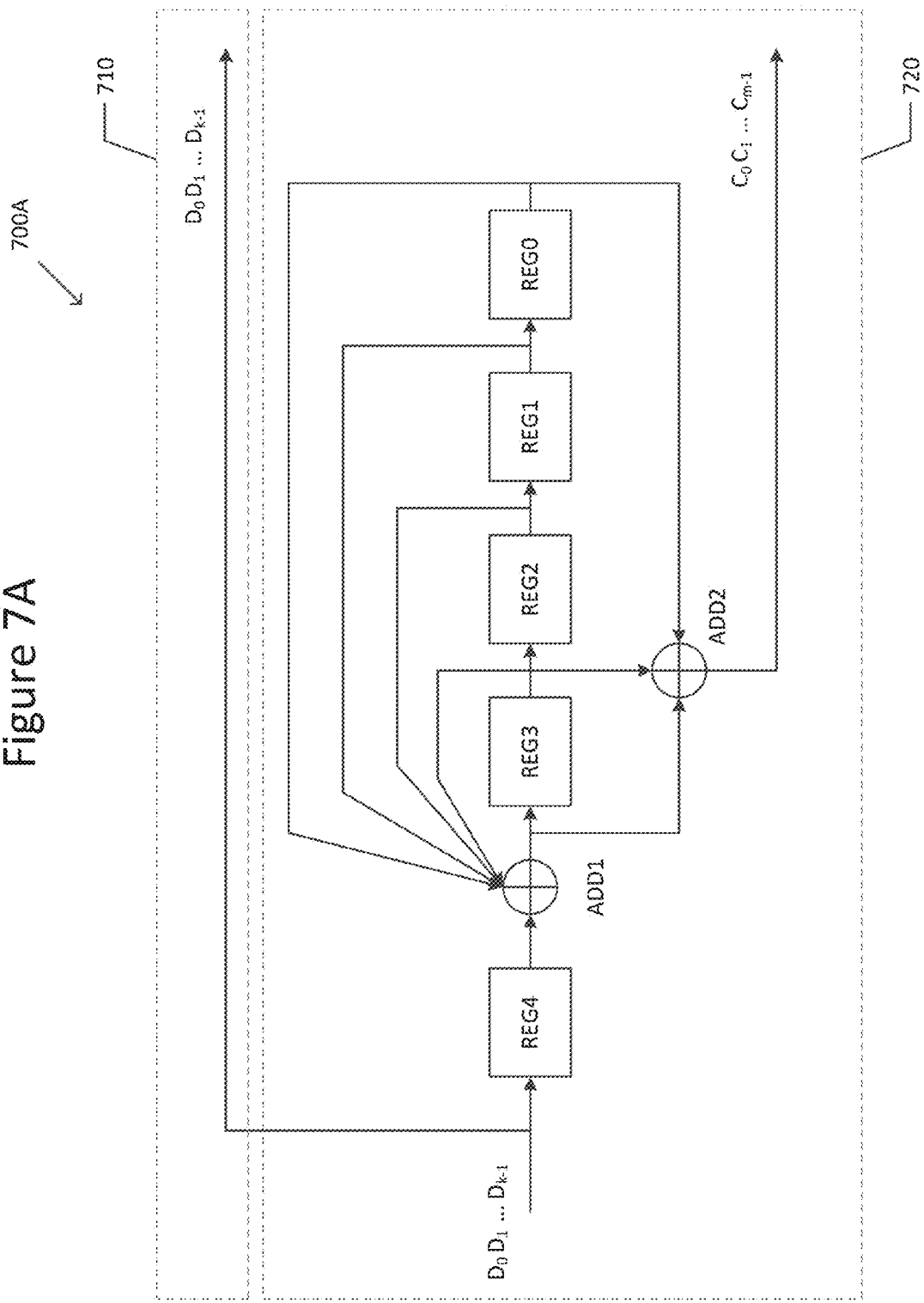
FIG. 7A illustrates a schematic diagram of an alternative convolutional encoder of the TCM of FIG. 1.

FIG. 7A illustrates a schematic diagram of an alternative convolutional encoder 700A of the TCM 100 of FIG. 1. In this case the convolutional encoder 700A is a 32-state, (77, 31) code having a rate of k/(k+m).

As compared with the convolutional encoders 300A, 400, 500 discussed above with respect to FIGS. 3A, 4, and 5, respectively, the convolutional encoder 700A is applicable to relatively higher coding rates over relatively shorter distances. While the convolutional encoders 300A, 400, 500 discussed above generates coded parity bits $C_t^1 C_t^2 \ldots C_t^{N-1}$ for each input bit $D_t$, the convolutional encoder 700A generates coded parity bits $C_0 C_1 \ldots C_{M-1}$ for a group of input bits $D_0 D_1 \ldots D_{k-1}$, thereby resulting in the higher coding rate. The convolutional encoders of the disclosure therefore enable both a low coding rate scheme and a high coding rate scheme without extending the modulation level.

The convolutional encoder 700A generates an encoded word $D_t\ C_t^1 C_t^2 \ldots C_t^{N-1}$ from an input word $D_t$. The convolutional encoder 700A has a first logic branch 710 and a second logic branch 720.

The first logic branch 710 configured to generate a data portion $D_0 D_1 \ldots D_{k-1}$ of the encoded word $D_0 D_1 \ldots D_{k-1} C_0 C_1 \ldots C_{M-1}$. The second logic branch 720, which coupled in parallel with the first logic branch 710, is configured to generate a corresponding parity portion $_1 C_0 C_1 \ldots C_{M-1}$ of the encoded word $D_0 D_1 \ldots D_{k-1} C_0 C_1 \ldots C_{M-1}$ sequentially after the generation of the data portion $D_0 D_1 \ldots D_{k-1}$ of the encoded word $D_0 D_1 \ldots D_{k-1} C_0 C_1 \ldots C_{M-1}$.

The second logic branch 720 has a similar structure to that of the second logic branch 520 of FIG. 5. For the sake of brevity, a detailed description will not be repeated here.

For an input word having k bits ($D_0\ D_1\ D_2 \ldots D_{k-1}$), the convolutional encoder 700A generates an encoded word having k+m bits ($D_0\ D_1\ D_2 \ldots D_{k-1}\ C_0\ C_1 \ldots C_{m-1}$).

The convolutional encoder 700A differs from a known convolutional encoder by the addition of the first register REG4, and also has different timing. The known convolutional encoder generates for an input word $D_t$ information bits and parity check bits simultaneously, and the coding state is updated correspondingly. This is not the case with the convolutional encoder 700A, which generates the parity-check bits in a sequential manner. When the input word $D_0 D_1 D_2 \ldots D_{k-1}$ is received at a first time instant, the upper branch 710 of the encoder 700A outputs the input word $D_0 D_1 D_2 \ldots D_{k-1}$ as the data portion of the encoded word $D_0 D_1 \ldots D_{k-1} C_0 C_1 \ldots C_{M-1}$, and the encoder state updates for each input bit. The final bit of the input word, that is $D_{k-1}$, is also held in the first register REG4, while m coded bits are output by the lower branch 720 during the next m time instants. The state of the convolutional encoder 700A is updated at every time instant, so the k+m coded bits are associated with their own coding states. As a result, the structure of a known trellis coded demodulator receiving the k+m coded bits can be preserved.

For the convolutional encoder 700A, many codes are options, though the code with a maximum Euclidean distance is optimal. For a given coding rate, this determination may be performed by a computer. For 2GFSK having a modulation index h=0.5 and Gaussian phase shaping factor BT=0.5, by way of example, the following good codes are found for a 32-state trellis:

½ rate codes: (71, 6), (63, 12) and (77, 5) code;
⅔ rate codes: (63, 15), (71, 10) and (63, 13) code;
⅘ rate codes: (75, 15), (75, 77) and (65, 1) code;
⅚ rate codes: (71, 11), (71, 17) and (75, 17) code; and
16/17 rate codes: (73, 17), (73, 35) and (65, 11) code.

Figure 7B:
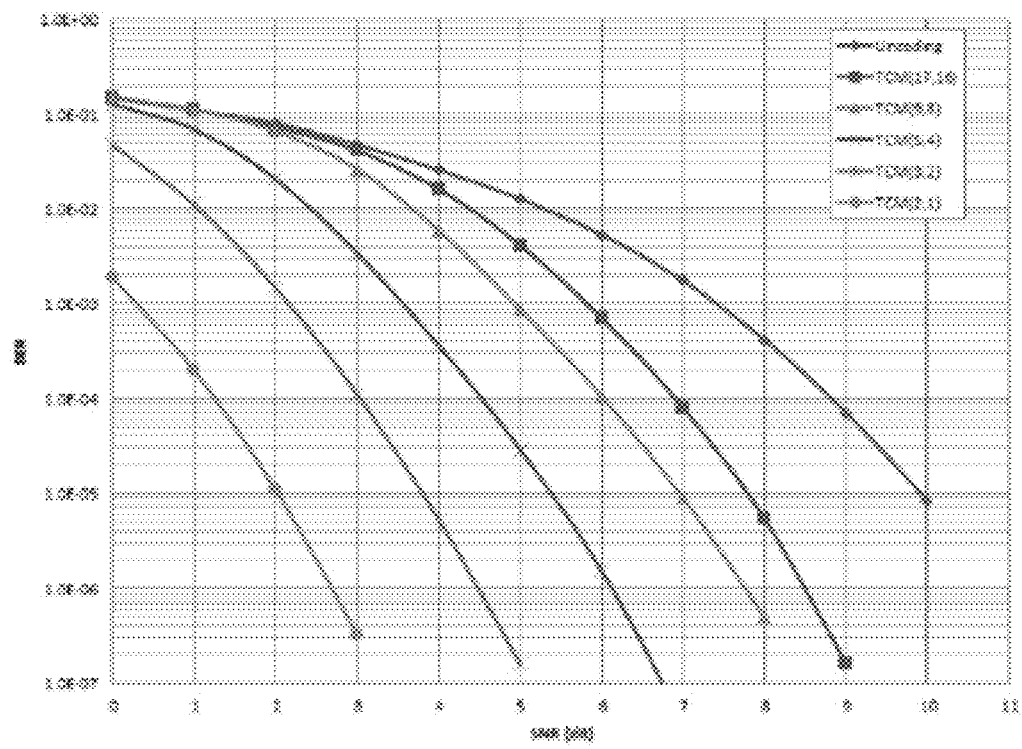
FIG. 7B illustrates a performance comparison graph of TCM codes.

FIG. 7B illustrates a performance comparison graph 700B of trellis coded modulation codes. The graph shows bit error rate (BER) versus signal-to-noise ratio (SNR). The performance of trellis coded modulation codes were simulated using 2GFSK modulation with a modulation index h=0.5 and Gaussian phase shaping factor BT=0.5 as an example. As can be seen, significant coding gain is achieved by the TCM encoder 700A.

Figure 7C:
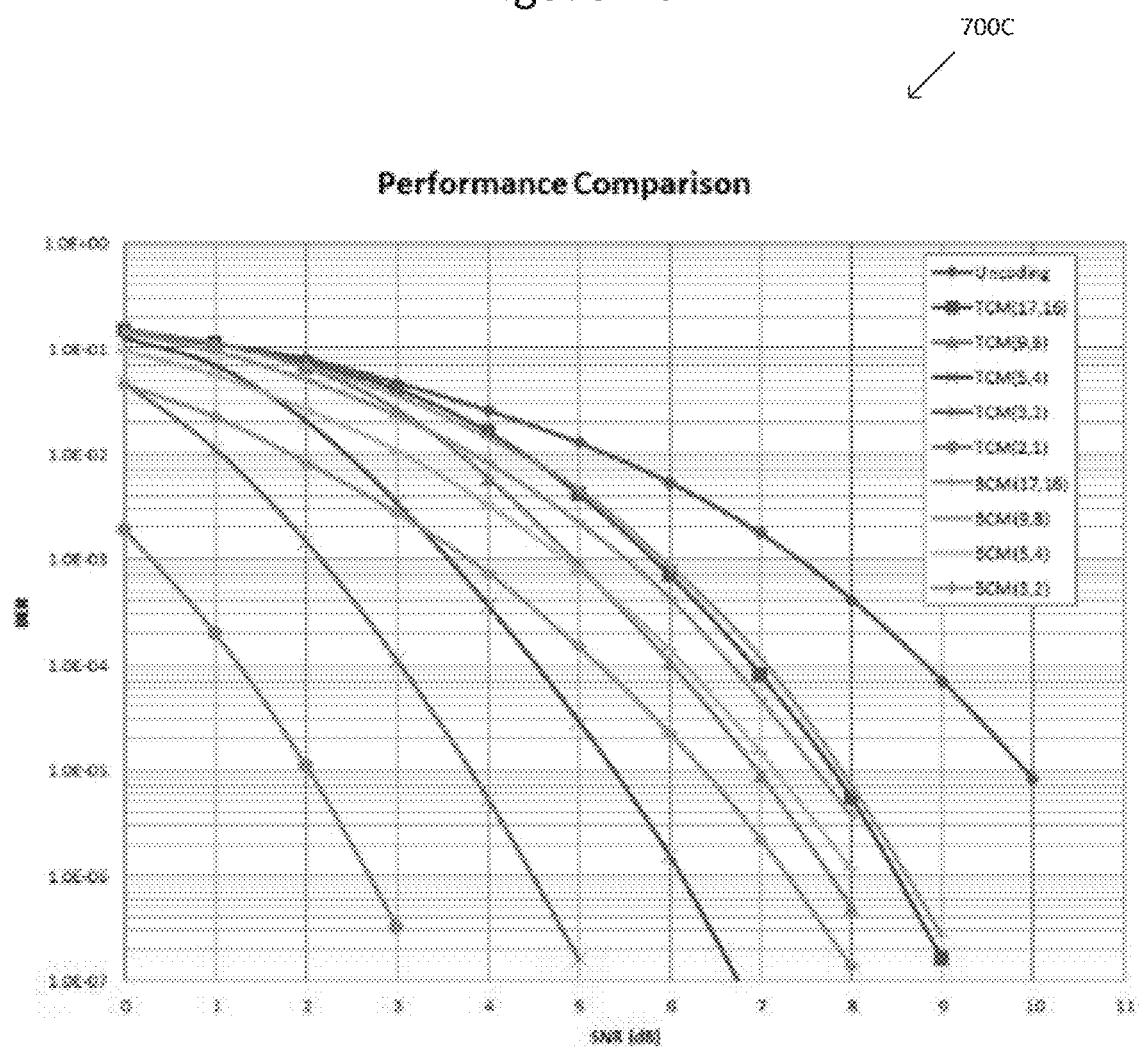
FIG. 7C illustrates a performance comparison graph between trellis coded modulation and block coded modulation (BCM).

FIG. 7C illustrates a performance comparison graph 700C of trellis coded modulation and block coded modulation (BCM). The graph shows bit error rate (BER) versus signal-to-noise ratio (SNR). As can be seen, with the same coding rate, the trellis coded modulation convolutional encoder 700A provides significant improvement over the BCM scheme. For example, with coding rate 2/3 at BER $10^{-5}$, the trellis coded modulation convolutional encoder 700A performed more than 2.5 dB better than the BCM scheme.

FIG. 8 illustrates flowchart 800 of a method for generating a trellis coded modulation encoded word from an input word.

At Step 810, a first logic branch 310/410/510/710 of a convolutional encoder 200A/300/400/600A generating a data portion $D_t$ of the encoded word $D_t\ C_t^1 C_t^2 \ldots C_t^{N-1}$.

At Step 820, a second logic branch 320/420/520/720 of the convolutional encoder 300A/400/500/700A coupled in parallel with the first logic branch 310/410/510/710, generates a corresponding parity portion $C_t^1 C_t^2 \ldots C_t^{N-1}$ of the encoded word sequentially after the generation of the data portion $D_t$ of the encoded word $D_t\ C_t^1 C_t^2 \ldots C_t^{N-1}$.

At Step 830, a modulator 120 modulates each of the bits of the data $D_t$ portion and of the parity portion $C_t^1 C_t^2 \ldots C_t^{N-1}$ of the encoded data word $D_t\ C_t^1 C_t^2 \ldots C_t^{N-1}$ into a respective symbol $S_t$. The modulation may comprise continuous phase modulation. Examples, of continuous phase modulation include GFSK modulation, more specifically, 2GFSK modulation. The disclosure is not limited to this type of continuous phase modulation, but may be any continuous phase modulation suitable for the intended purpose.

The disclosure also includes a computer program product embodied on a non-transitory computer-readable medium comprising program instructions configured such that when executed by processing circuitry cause the processing circuitry to implement the method of the flowchart 800 of FIG. 8.

This disclosure illustrates convolutional encoders with 32-state trellis codes, but the disclosure is not limited in this respect. The disclosure is applicable to any number of trellis states. In fact, with increasing number of trellis states, even higher gains may be achieved.

Example 1 is a trellis coded modulator (TCM) for generating an encoded word from an input word, the TCM comprising a first logic branch configured to generate a data portion of the encoded word; and a second logic branch, coupled in parallel with the first logic branch, and configured to generate a corresponding parity portion of the encoded word sequentially after the generation of the data portion of the encoded word.

In Example 2, the subject matter of Example 1, wherein the second logic branch comprises a register configured to hold a final bit of the input word until after the parity portion of the encoded word is generated.

In Example 3, the subject matter of Example 2, wherein the data portion of the encoded word comprises one bit.

In Example 4, the subject matter of Example 2, wherein the data portion of the encoded word comprises a plurality of bits.

In Example 5, the subject matter of Example 1, further comprising: a convolutional encoder comprising the first and second logic branches; and a modulator configured to modulate each of the bits of the data and parity portions of the encoded data word into a respective symbol.

In Example 6, the subject matter of Example 5, wherein the modulator is configured to perform continuous phase modulation.

In Example 7, the subject matter of Example 5, wherein the modulator is configured to perform 2GFSK (Gaussian frequency-shift keying) modulation.

In Example 8, the subject matter of Example 1, wherein the second logic branch comprises a first register having an input configured to receive the input word and an output; a first modulo 2 adder having a first input coupled to the output of the first register, a second input, a third input, and an output; a second register having an input coupled to the output of the first modulo 2 adder and an output coupled to the third input of the first modulo 2 adder;
  a second modulo 2 adder having a first input coupled to the output of the second register, a second input, and an output configured to output the parity portion of the encoded word; and a third register having an input coupled to the output of the second register, and an output coupled to the second input of the first modulo 2 adder and to the second input of the second modulo 2 adder.

In Example 9, the subject matter of Example 1, wherein the second logic branch comprises a first register having an input configured to receive the input word and an output; a first modulo 2 adder having a first input coupled to the output of the first register, a second input, a third input, and an output; a second register having an input coupled to the output of the first modulo 2 adder and an output coupled to the third input of the first modulo 2 adder;
  a second modulo 2 adder having a first input coupled to the output of the first modulo 2 adder, a second input, and an output configured to output the parity portion of the encoded word; a third register having an input coupled to the output of the second register and an output; and a fourth register having an input coupled to the output of the third register, and an output coupled to the second input of the first modulo 2 adder and to the second input of the second modulo 2 adder.

In Example 10, the subject matter of Example 1, wherein the second logic branch comprises a first register having an input configured to receive the input word and an output; a first modulo 2 adder having a first input coupled to the output of the first register, a second input, a third input, a fourth input, a fifth input, and an output; a second register having an input coupled to the output of the first modulo 2 adder and an output coupled to the fifth input of the first modulo 2 adder; a second modulo 2 adder having a first input coupled to the output of the first modulo 2 adder, a second input coupled to the output of the second register, a third input, and an output configured to output the parity portion of the encoded word; a third register having an input coupled to the output of the second register, and an output coupled to the fourth input of the first modulo 2 adder; a fourth register having an input coupled to the output of the third register and an output coupled to the third input of the first modulo 2 adder; and a fifth register having an input coupled to the output of the fourth register, and an output coupled to the second input of the first modulo 2 adder and to the third input of the second modulo 2 adder.

Example 11 is a wireless communication device comprising the TCM of Example 1.

Example 12 is a method for generating a trellis coded modulation (TCM) encoded word from an input word, the method comprising generating, by a first logic branch of a convolutional encoder, a data portion of the encoded word; and generating, by a second logic branch of a convolutional encoder coupled in parallel with the first logic branch, a corresponding parity portion of the encoded word sequentially after the generation of the data portion of the encoded word.

In Example 13, the subject matter of Example 12, further comprising holding, by a register in the second logic branch, a final bit of the input word until after the parity portion of the encoded word is generated.

In Example 14, the subject matter of Example 13, wherein the data portion of the encoded word comprises one bit.

In Example 15, the subject matter of Example 13, wherein the data portion of the encoded word comprises a plurality of bits.

In Example 16, the subject matter of Example 12, further comprising modulating, by a modulator, each of the bits of the data and parity portions of the encoded data word into a respective symbol.

In Example 17, the subject matter of Example 16, wherein the modulating comprises continuous phase modulation.

In Example 18, the subject matter of Example 15, wherein the modulating comprises 2GFSK (Gaussian frequency-shift keying) modulation.

Example 19 is a computer program product embodied on a non-transitory computer-readable medium comprising program instructions configured such that when executed by processing circuitry cause the processing circuitry to implement the method of Example 12.

Example 20 is a trellis coded modulator (TCM) for generating an encoded word from an input word, the TCM encoder comprising a first logic means for generating a data portion of the encoded word; and a second logic means, coupled in parallel with the first logic means, for generating a corresponding parity portion of the encoded word sequentially after the generation of the data portion of the encoded word.

In Example 21, the subject matter of Example 20, wherein the second logic means comprises a register configured to hold a final bit of the input word until after the parity portion of the encoded word is generated.

In Example 22, the subject matter of Example 21, wherein the register increases a constraint length of the encoder.

In Example 23, the subject matter of Example 20, further comprising a convolutional encoding means comprising the first and second logic means; and a modulation means for modulating each of the bits of the data and parity portions of the encoded data word into a respective symbol.

In Example 24, the subject matter of Example 23, wherein the modulation means is a continuous phase modulation means.

In Example 25, the subject matter of Example 23, wherein the modulation means is a configured to perform 2GFSK (Gaussian frequency-shift keying) modulation means.

In Example 26, the subject matter of any of Examples 1-4, further comprising a convolutional encoder comprising the first and second logic branches; and a modulator configured to modulate each of the bits of the data and parity portions of the encoded data word into a respective symbol.

In Example 27, the subject matter of any of Examples 1-7, wherein the second logic branch comprises a first register having an input configured to receive the input word and an output; a first modulo 2 adder having a first input coupled to the output of the first register, a second input, a third input, and an output; a second register having an input coupled to the output of the first modulo 2 adder and an output coupled to the third input of the first modulo 2 adder; a second modulo 2 adder having a first input coupled to the output of the second register, a second input, and an output configured to output the parity portion of the encoded word; and a third register having an input coupled to the output of the second register, and an output coupled to the second input of the first modulo 2 adder and to the second input of the second modulo 2 adder.

In Example 28, the subject matter of any of Examples 1-7, wherein the second logic branch comprises a first register having an input configured to receive the input word and an output; a first modulo 2 adder having a first input coupled to the output of the first register, a second input, a third input, and an output; a second register having an input coupled to the output of the first modulo 2 adder and an output coupled to the third input of the first modulo 2 adder; a second modulo 2 adder having a first input coupled to the output of the first modulo 2 adder, a second input, and an output configured to output the parity portion of the encoded word; a third register having an input coupled to the output of the second register and an output; and a fourth register having an input coupled to the output of the third register, and an output coupled to the second input of the first modulo 2 adder and to the second input of the second modulo 2 adder.

In Example 29, the subject matter of any of Examples 1-7, wherein the second logic branch comprises a first register having an input configured to receive the input word and an output; a first modulo 2 adder having a first input coupled to the output of the first register, a second input, a third input, a fourth input, a fifth input, and an output; a second register having an input coupled to the output of the first modulo 2 adder and an output coupled to the fifth input of the first modulo 2 adder; a second modulo 2 adder having a first input coupled to the output of the first modulo 2 adder, a second input coupled to the output of the second register, a third input, and an output configured to output the parity portion of the encoded word; a third register having an input coupled to the output of the second register, and an output coupled to the fourth input of the first modulo 2 adder; a fourth register having an input coupled to the output of the third register and an output coupled to the third input of the first modulo 2 adder; and a fifth register having an input coupled to the output of the fourth register, and an output coupled to the second input of the first modulo 2 adder and to the third input of the second modulo 2 adder.

Example 30 is a wireless communication device comprising the TCM of any of Examples 1-10.

In Example 31, the subject matter of any of Examples 12-15 and 18, further comprising modulating, by a modulator, each of the bits of the data and parity portions of the encoded data word into a respective symbol.

Example 32 is a computer program product embodied on a non-transitory computer-readable medium comprising program instructions configured such that when executed by processing circuitry cause the processing circuitry to implement the method of any of Examples 12-18.

In Example 33, the subject matter of any of Examples 20-22, further comprising a convolutional encoding means comprising the first and second logic means; and a modulation means for modulating each of the bits of the data and parity portions of the encoded data word into a respective symbol.

Example 34 is an apparatus substantially as shown and described.

Example 35 is a method substantially as shown and described.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover any adaptations or variations of the specific embodiments discussed herein.

The invention claimed is:

1. A trellis coded modulator (TCM) for generating an encoded word from an input word, the TCM comprising:
    a single encoder,
    wherein the single encoder comprises:
        a first logic branch configured to generate a data portion of the encoded word; and
        a second logic branch, coupled in parallel with the first logic branch, and configured to generate a corresponding parity portion of the encoded word sequentially after the generation of the data portion of the encoded word, wherein the second logic branch comprises a first register configured to hold a final bit of the input word until after the generation of the parity portion of the encoded word.

2. The TCM of claim 1, wherein the data portion of the encoded word comprises one bit.

3. The TCM of claim 1, wherein the data portion of the encoded word comprises a plurality of bits.

4. The TCM of claim 1, further comprising:
    a convolutional encoder comprising the first and second logic branches; and
    a modulator configured to modulate each of the bits of the data and parity portions of the encoded data word into a respective symbol.

5. The TCM of claim 4, wherein the modulator is configured to perform continuous phase modulation.

6. The TCM of claim 4, wherein the modulator is configured to perform 2GFSK (Gaussian frequency-shift keying) modulation.

7. The TCM of claim 1, wherein the second logic branch comprises:
    the first register having an input configured to receive the input word and an output;
    a first modulo 2 adder having a first input coupled to the output of the first register, a second input, a third input, and an output;
    a second register having an input coupled to the output of the first modulo 2 adder and an output coupled to the third input of the first modulo 2 adder;
    a second modulo 2 adder having a first input coupled to the output of the second register, a second input, and an output configured to output the parity portion of the encoded word; and
    a third register having an input coupled to the output of the second register, and an output coupled to the second input of the first modulo 2 adder and to the second input of the second modulo 2 adder.

8. The TCM of claim 1, wherein the second logic branch comprises:
    the first register having an input configured to receive the input word and an output;
    a first modulo 2 adder having a first input coupled to the output of the first register, a second input, a third input, and an output;
    a second register having an input coupled to the output of the first modulo 2 adder and an output coupled to the third input of the first modulo 2 adder;
    a second modulo 2 adder having a first input coupled to the output of the first modulo 2 adder, a second input, and an output configured to output the parity portion of the encoded word;
    a third register having an input coupled to the output of the second register and an output; and
    a fourth register having an input coupled to the output of the third register, and an output coupled to the second input of the first modulo 2 adder and to the second input of the second modulo 2 adder.

9. The TCM of claim 1, wherein the second logic branch comprises:
   the first register having an input configured to receive the input word and an output;
   a first modulo 2 adder having a first input coupled to the output of the first register, a second input, a third input, a fourth input, a fifth input, and an output;
   a second register having an input coupled to the output of the first modulo 2 adder and an output coupled to the fifth input of the first modulo 2 adder;
   a second modulo 2 adder having a first input coupled to the output of the first modulo 2 adder, a second input coupled to the output of the second register, a third input, and an output configured to output the parity portion of the encoded word;
   a third register having an input coupled to the output of the second register, and an output coupled to the fourth input of the first modulo 2 adder;
   a fourth register having an input coupled to the output of the third register and an output coupled to the third input of the first modulo 2 adder; and
   a fifth register having an input coupled to the output of the fourth register, and an output coupled to the second input of the first modulo 2 adder and to the third input of the second modulo 2 adder.

10. A wireless communication device comprising the TCM of claim 1.

11. A method for generating a trellis coded modulation (TCM) encoded word from an input word, the method comprising:
   generating, by a first logic branch of a convolutional encoder, a data portion of the encoded word;
   generating, by a second logic branch of a convolutional encoder coupled in parallel with the first logic branch, a corresponding parity portion of the encoded word sequentially after the generation of the data portion of the encoded word; and
   holding, by a register comprised within the second logic branch, a final bit of the input word until after the generation of the parity portion of the encoded word, wherein the convolutional encoder is a single convolutional encoder comprised within a trellis coded modulator.

12. The method of claim 11, wherein the data portion of the encoded word comprises one bit.

13. The method of claim 11, wherein the data portion of the encoded word comprises a plurality of bits.

14. The method of claim 11, further comprising:
   modulating, by a modulator, each of the bits of the data and parity portions of the encoded data word into a respective symbol.

15. The method of claim 14, wherein the modulating comprises continuous phase modulation.

16. The method of claim 14, wherein the modulating comprises 2GFSK (Gaussian frequency-shift keying) modulation.

17. A computer program product embodied on a non-transitory computer-readable medium comprising program instructions configured such that when executed by processing circuitry cause the processing circuitry to implement the method of claim 11.

18. A trellis coded modulator (TCM) for generating an encoded word from an input word, the TCM encoder comprising:
   a single encoder, wherein the single encoder comprises:
      a first logic means for generating a data portion of the encoded word; and
      a second logic means, coupled in parallel with the first logic means, for generating a corresponding parity portion of the encoded word sequentially after the generation of the data portion of the encoded word, wherein the second logic means comprises a register for holding a final bit of the input word until after the parity portion of the encoded word is generated.

19. The TCM of claim 18, wherein the register increases a constraint length of the encoder.

20. The TCM of claim 18, further comprising:
   a convolutional encoding means comprising the first and second logic means; and
   a modulation means for modulating each of the bits of the data and parity portions of the encoded data word into a respective symbol.

21. The TCM of claim 20, wherein the modulation means is a continuous phase modulation means.

22. The TCM of claim 20, wherein the modulation means is a configured to perform 2GFSK (Gaussian frequency-shift keying) modulation means.

* * * * *